(12) United States Patent
Masuda et al.

(10) Patent No.: US 7,171,632 B2
(45) Date of Patent: Jan. 30, 2007

(54) APPARATUS, METHOD AND PROGRAM FOR DESIGNING SEMICONDUCTOR INTEGRATED CIRCUIT

(75) Inventors: Atsushi Masuda, Kanagawa (JP); Atsushi Mizuno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 10/851,071

(22) Filed: May 24, 2004

(65) Prior Publication Data

US 2005/0039148 A1    Feb. 17, 2005

(30) Foreign Application Priority Data

Aug. 12, 2003 (JP) .............................. 2003-292134

(51) Int. Cl.
*G06F 17/50* (2006.01)
(52) U.S. Cl. ................................. 716/1; 716/3; 716/18
(58) Field of Classification Search ................ 716/1–3, 716/16–18
See application file for complete search history.

(56) References Cited

U.S. PATENT DOCUMENTS

| | | | | |
|---|---|---|---|---|
| 5,995,736 | A * | 11/1999 | Aleksic et al. ................. | 716/18 |
| 6,209,120 | B1 | 3/2001 | Kurshan et al. | |
| 6,477,683 | B1 * | 11/2002 | Killian et al. ................... | 716/1 |
| 6,634,017 | B2 | 10/2003 | Matsui et al. | |
| 6,898,771 | B2 * | 5/2005 | Tojima et al. ................. | 716/10 |
| 6,996,799 | B1 * | 2/2006 | Cismas et al. ............... | 717/106 |
| 7,020,854 | B2 * | 3/2006 | Killian et al. ................... | 716/1 |
| 2004/0098701 | A1 * | 5/2004 | Klein ........................... | 716/18 |

FOREIGN PATENT DOCUMENTS

JP    2000-57188    2/2000

OTHER PUBLICATIONS

Chou et al., The Chinook hardware/software co-synthesis system, Sep. 1995, ACM, pp. 1-6.*
Eles et al., Hardware/software partitioning of VHDL system specifications, Sep. 1996, ACM, pp. 1-6.*
Mentor Graphics Japan Corporation, News and View, pp. 1-5, "Plateform-Based Design Methodology; Platform Express", Feb. 2002.

* cited by examiner

*Primary Examiner*—Jack Chiang
*Assistant Examiner*—Nghia M. Doan
(74) *Attorney, Agent, or Firm*—Oblon, Spivak, McClelland, Maier & Neustadt, P.C.

(57) ABSTRACT

An apparatus for designing a semiconductor integrated circuit having a configurable processor includes: a software information storage section storing software information including software descriptions; a hardware information storage section storing hardware information including hardware descriptions of the semiconductor integrated circuit; a processor information storage section storing processor information; a hardware implementation specification section specifying an algorithm of a portion to be implemented by hardware from among the software descriptions; a hardware changing section generating hardware descriptions from the algorithm of the specified portion, and changing the hardware information and the processor information; a software changing section generating software descriptions in which the algorithm of the specified portion is replaced with an algorithm for controlling the implemented hardware, and changing the software information; and a performance analyzer analyzing a performance of the semiconductor integrated circuit based on the changed software information, the changed hardware information and the changed processor information.

15 Claims, 6 Drawing Sheets

| FUNCTION NAME | CALL-AND-CALLED RELATION | | NUMBER OF TIMES TO CALL | NUMBER OF INSTRUC-TIONS | NUMBER OF PROCESSING CYCLES | TYPE OF INSTRUCTION | .... |
|---|---|---|---|---|---|---|---|
| | CALLING FUNCTION | CALLED FUNCTION | | | | | |
| A | | B,C,E | 1 | 30 | 146 | ADD-SUBTRACT INSTRUCTION, BRANCH INSTRUCTION, ... | |
| B | A | | 1 | 157 | 267 | MOVE INSTRUCTION, INPUT-OUTPUT INSTRUCTION, ... | |
| C | A | D | 1 | 195 | 1092 | MULTIPLICATION INSTRUCTION, ... | |
| D | C | | 3 | 9 | 18 | ADD-SUBTRACT INSTRUCTION, BRANCH INSTRUCTION, ... | |
| ⋮ | ⋮ | ⋮ | ⋮ | ⋮ | ⋮ | ⋮ | |

FIG. 4A

| MODULE NAME | NUMBER OF EXECUTION CYCLES | NUMBER OF GATES | .... |
|---|---|---|---|
| A | 1 | 146 | |
| B | 1 | 147 | |
| ⋮ | ⋮ | ⋮ | |

FIG. 4B

| PROCESSOR | |
|---|---|
| NUMBER OF INSTRUCTIONS | 72 |
| NUMBER OF REGISTERS | 16 |
| SIZE OF PROGRAM MEMORY | 16 [bit] × 128 [word] |
| ⋮ | ⋮ |

```
   ⋮
void lfilter()
{
int i,j,k;                    Laplace CONVERSION PROCESSING SECTION
                                              (
    for( i=1 ; i<PICX-1 ; i++ )
        for( j=1 ; j<PICY-1 ; j++ ) {
            k=      pic[i-1][j-1]+pic[i][j-1]+pic[i+1][j-1]+
                    pic[i-1][j  ]-pic[i][j]*8+pic[i+1][j  ]+
                    pic[i-1][j+1]+pic[i][j+1]+pic[i+1][j+1];
            ans[i-1][j-1]=k>>3;
        }
}
   ⋮
```

FIG. 8

```
   ⋮
void _inline lfilter()
{
int _flg;
char *_p0;
char *_pc8;                 INPUT/OUTPUT PROCESSING TO REPLACED HARDWARE
int _i;                                       (
    _pc8=(char *)0x006000c8;                  ⎫ ⋯ TRANSMIT VALUE OF ARRANGEMENT
    for( _i=0 ; _i<256 ; _i++ )               ⎬      pic TO ADDRESS OF 0x6000c8
        *_pc8++=pic[_i/16][_i%16];            ⎭
    stcb(1,0x4001);                           ⋯⋯ STARTUP HARDWARE
    do {                                      ⎫
        ldcb(_flg,0x4001);                    ⎬ ⋯ WAIT UNTIL ZERO IS SET
    } while( _flg );                          ⎭      TO FLAG AT ADDRESS OF 0x4001
    _p0=(char *)0x00600000;                   ⎫
    for( _i=0 ; _i<196 ; _i++ )               ⎬ ⋯ ACQUIRE ans FROM ADDRESS
        ans[_i/14][_i%14]=*_p0++;             ⎭      0x600000
}
   ⋮
```

APPARATUS, METHOD AND PROGRAM FOR DESIGNING SEMICONDUCTOR INTEGRATED CIRCUIT

CROSS REFERENCE TO RELATED APPLICATIONS

This application claims benefit of priority under 35 USC § 119 to Japanese Patent Application No. 2003-292134 filed on Aug. 12, 2003, the entire contents of which are incorporated by reference herein.

BACKGROUND OF THE INVENTION

1. Field of the Invention

The present invention pertains to an apparatus, a computer implemented method and a computer executable program for designing a semiconductor integrated circuit including a processor configurable in accordance with a target (configurable processor). In particular, the present invention pertains to a technology for aid to divide functions into portions implemented by hardware and portions implemented by software as an execution program from among software description in which the algorithm of a semiconductor integrated circuit is described.

2. Description of the Related Art

Conventionally, in a system LSI design of a System on Chip (SoC) installing a processor (configurable processor) in which instructions can be added and/or configurations can be changed according to a target, as for a designer, it is indispensable to describe a source program for an algorithm required of a system for development by using high-level languages, such as C programming language, and to perform a system simulation in a higher level in order to verify functions as the system.

Figure 1:
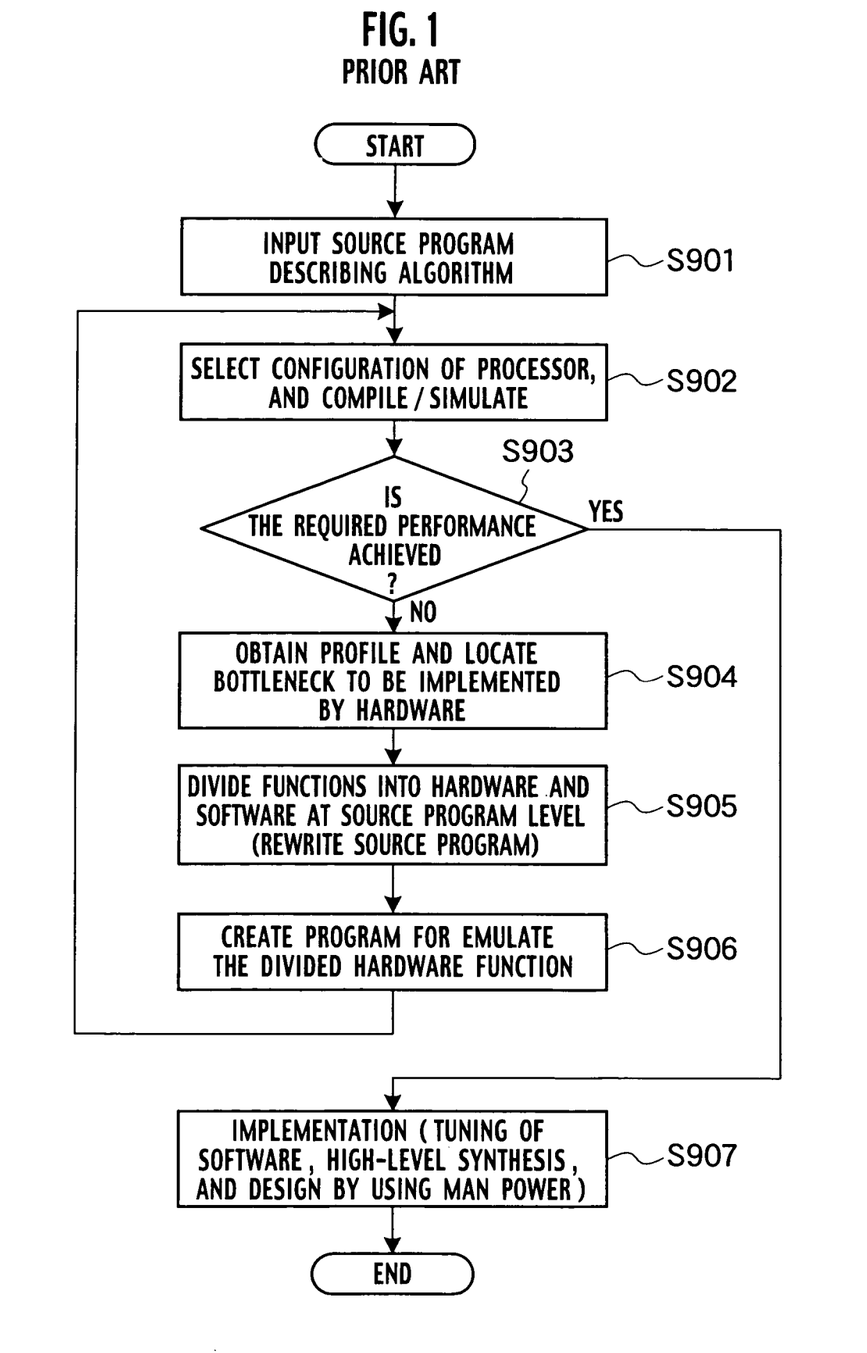
FIG. 1 is a flow chart showing an example of a typical design procedure of a system LSI including a configurable processor.

More specifically, as shown in FIG. 1, the source program in which the algorithm is described is inputted in Step S901. In Step S902, the designer selects a configuration of the processor, performs compiling the source program, and performs the system simulation in the higher level, and then, in Step S903, the designer verifies whether or not required performance is achieved.

As a result of the verification in Step S903, if the required performance is not achieved, the designer obtains a profile at the source program level and locates a bottleneck to be implemented by hardware, in Step S904. Furthermore, in Step S905, the designer selects a portion to be replaced with hardware from among the functions described in the source program, that is, the designer divides the functions into the hardware and the software at the source program level, and rewrites the source program. The designer, in Step S906, creates a program for emulating the newly divided hardware function.

Then, the designer, in Step S902, retries the system simulation, and, in Step S903, verifies whether or not the required performance is achieved. As a result of the verification, if the required performance is achieved, the work for implementation, such as a tune-up the software, a high-level synthesis, a design by using manpower, and the like, is performed in Step S907.

The above-mentioned series of processing, such as the locating the bottleneck to be implemented by the hardware (Step S904), selecting the portion to be replaced with the hardware and writing the source program (Step S905), and creating the program for emulating (Step S906), is repeatedly performed until the system simulation result is satisfied. Therefore, the processing by using manpower, such as rewriting of the source program, correcting the simulation environment, and the like, became a burden, and the time and cost involved to the design were increased.

For this reason, an apparatus for supporting performance evaluation in an initial stage in the dividing work of hardware and software is disclosed in Japanese patent Laid Open Publication (Kokai) No. 2000-57188. This apparatus supports the performance evaluation by generating and displaying new hardware information and new software information based on hardware parts information and software parts information stored in a database, when a designer registers desired device as new parts on a screen.

Further, a methodology for smoothing the way to design by enabling a designer to select a library of a processor, a memory and a circumference circuit by using a graphical design editor, and for generating a circuit and software design environment based on the selected items is disclosed in a paper "Platform-Based Design Methodology; Platform Express", Mentor Graphics Japan Corporation, News and View, February, 2002. ("Platform Express" is a trademark of Mentor Graphics Corporation.)

However, the apparatus disclosed in the publication No. 2000-57188 cannot display information in consideration of the influence upon the composition of a processor by selecting a portion replaced with hardware from an algorithm described in a source program and dividing functions. The apparatus therefore cannot design in consideration of performance of a configurable processor. Furthermore, the apparatus has no support function for improving a compiler and simulation environment. Therefore, since a human mistake at the time of environmental maintenance occurs, there is a problem of causing deterioration of design quality and protraction of a design period.

Although the function to improve the software design environment changed based on selection of hardware is shown in the above paper "Platform Express™ Platform-Based Soc Design and verification", the function is not corresponding to the configurable processor, and there is no function to select a portion to be implemented by hardware from an algorithm described by the source program and to divide functions, which are necessity to the top-down design process for programming an algorithm required for LSI by using a high-level language. Therefore, it is not possible to correspond to the design from the algorithm description using the configurable processor. Thus, in the design from the higher level using the algorithm description, manpower, such as rewriting of the source program and correction of simulation environment, is needed, and there is a problem of causing deterioration of design quality and protraction of a design period.

SUMMARY OF THE INVENTION

An apparatus for designing a semiconductor integrated circuit having a processor configurable in accordance with a target, according to an embodiment of the present invention includes: a software information storage section configured to store software information including software descriptions in which an algorithm required of the semiconductor integrated circuit is described; a hardware information storage section configured to store hardware information including hardware descriptions of the semiconductor integrated circuit; a processor information storage section configured to store processor information of the processor; a hardware implementation specification section configured to specify an algorithm of a portion to be implemented by hardware from among the software descriptions; a hardware changing section configured to generate hardware descriptions from the algorithm of the specified portion to be implemented by the hardware, and then change the hardware information and the processor information; a software changing section configured to generate software descriptions in which the algorithm of the specified portion to be implemented by the hardware is replaced with an algorithm for controlling the hardware, and then change the software information; and a performance analyzer configured to analyze a performance of the semiconductor integrated circuit based on the changed software information, the changed hardware information and the changed processor information.

Furthermore, a computer implemented method for designing a semiconductor integrated circuit having a processor configurable in accordance with a target, according to an embodiment of the present invention includes: analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit; accepting specification of an algorithm of a portion to be implemented by hardware from among the software descriptions according to a result of the performance analysis; generating hardware descriptions from an algorithm of the specified portion to be implemented by the hardware, and changing the hardware information and the processor information; generating software descriptions in which the algorithm of the specified portion to be implemented by the hardware is replaced with an algorithm for controlling the hardware, and changing the software information; and analyzing the performance of the semiconductor integrated circuit based on the changed software information, the changed hardware information and the changed processor information.

Moreover, a computer executable program for designing a semiconductor integrated circuit having a processor configurable in accordance with a target, according to an embodiment of the present invention includes: analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit; accepting specification of an algorithm of a portion to be implemented by hardware from among the software descriptions according to a result of the performance analysis; generating hardware descriptions from an algorithm of the specified portion to be implemented by the hardware, and changing the hardware information and the processor information; generating software descriptions in which the algorithm of the specified portion to be implemented by the hardware is replaced with an algorithm for controlling the hardware, and changing the software information; and analyzing the performance of the semiconductor integrated circuit based on the changed software information, the changed hardware information and the changed processor information.

DETAILED DESCRIPTION

Various embodiments of the present invention will be described herein below with reference to the accompanying drawings. It is to be noted that the same or similar reference numerals are applied to the same or similar parts and elements throughout the drawings, and the description of the same or similar parts and elements will be omitted or simplified.

The present embodiment aims to disclose a design apparatus, a design method and a design program, which can obtain easily information for verifying whether or not required performance is achieved, whenever a portion replaced with hardware is selected from functions described in a source program, and is enable to design a semiconductor integrated circuit including a configurable processor in consideration of the influence upon a configurable processor.

Components of Design Apparatus

An apparatus for designing a semiconductor integrated circuit according to the present embodiment is a design apparatus for designing semiconductor integrated circuit including a configurable processor in which instructions can be added or configurations can be changed according to a target system. The design apparatus is, for example, implemented by a computer system having a central processing unit, a memory storage, an input unit, an output unit, and the like.

Figure 2:
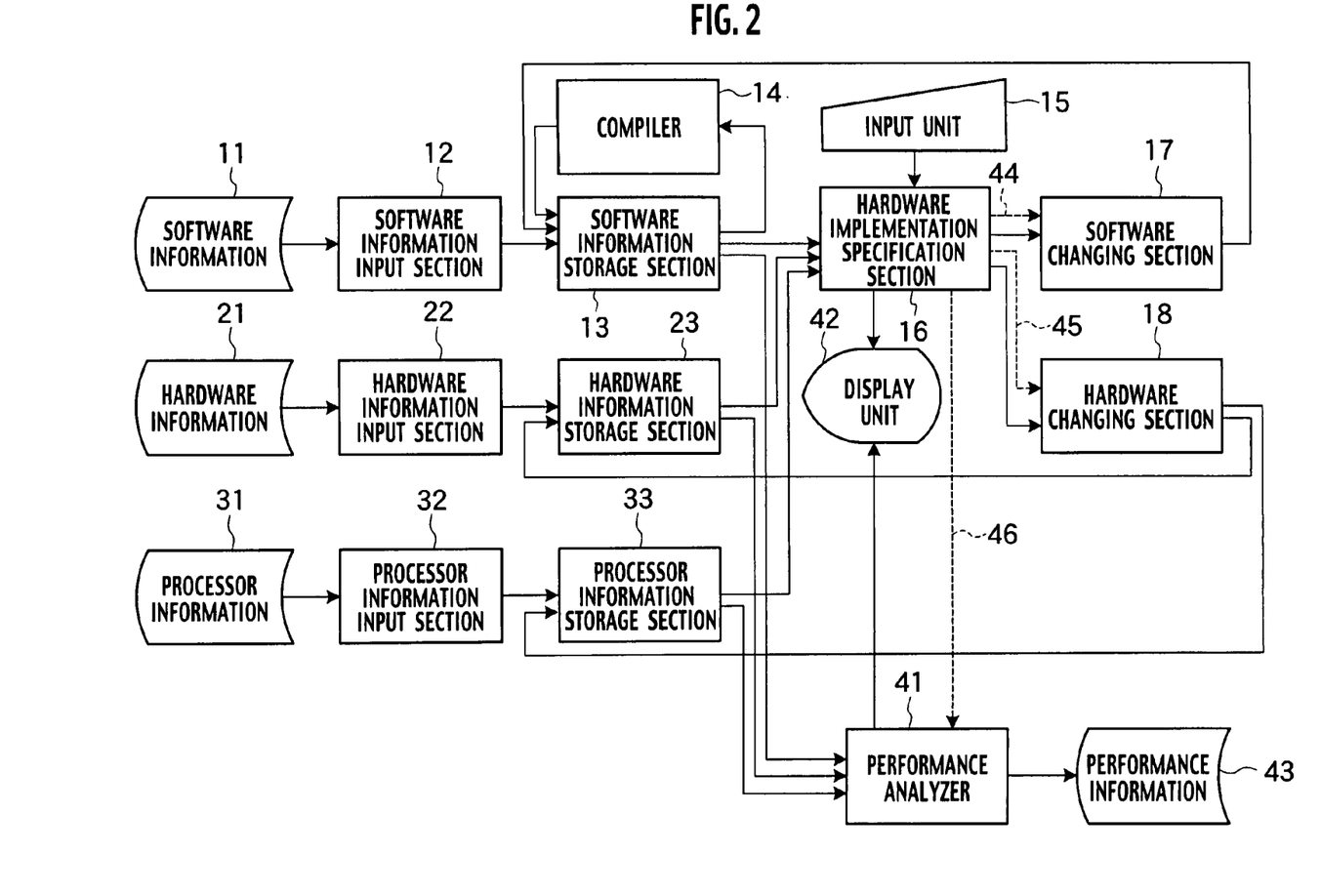
FIG. 2 is a simplified block diagram showing an example of the configuration of an apparatus for designing a semiconductor integrated circuit including a configurable processor according to an embodiment of the present invention.

As shown in FIG. 2, the design apparatus of the embodiment of the present invention includes a software information input section 12, a software information storage section 13, a hardware information input section 22, a hardware information storage section 23, a processor information input section 32, a processor information storage section 33, a compiler 14, an input unit 15, a hardware implementation specification section 16, a software changing section 17, a hardware changing section 18, a performance analyzer 41, a display unit 42, and the like.

Figure 3:
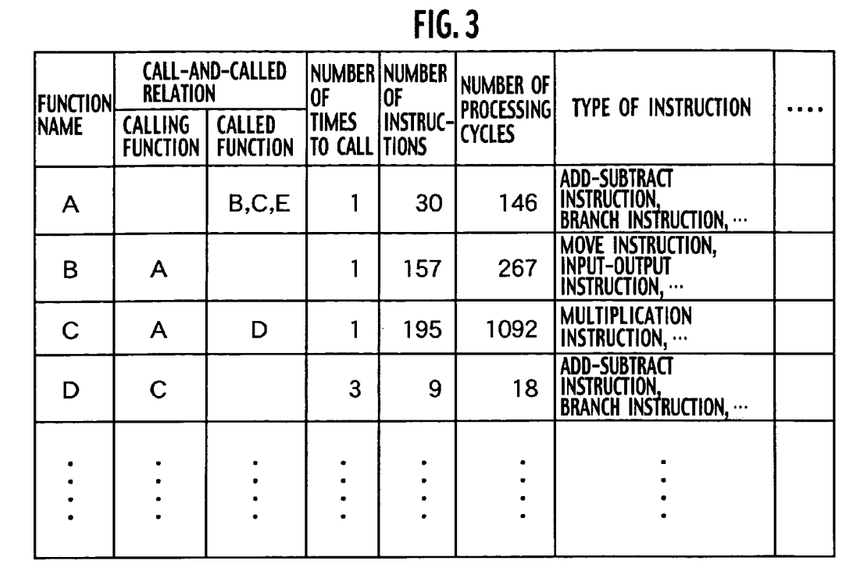
FIG. 3 is an illustration showing an example of a profile obtained as a result of compiling a source program in which an algorithm of the semiconductor integrated circuit for development is described.

The software information input section 12 inputs software information 11 including software descriptions (source program) in which an algorithm required of a system LSI for development is described, and then stores the software information 11 in the software information storage section 13. The compiler 14 compiles the source program stored in the software information storage section 13, and then obtains a profile and stores the obtained profile in the software information storage section 13. As shown in FIG. 3, the profile includes software information, such as a call-and-called relationship between functions, the number of times to call the functions, the number of instructions and the type of instructions included in the functions, the number of processing cycles, and the like.

Figure 4A:
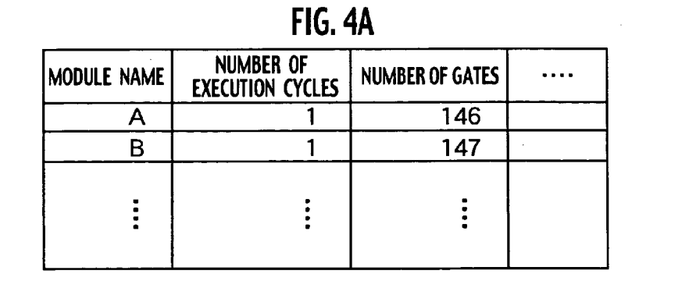
FIG. 4A is an illustration showing an example of hardware information of the semiconductor integrated circuit for development.

The hardware information input section 22 inputs hardware information 21 including hardware descriptions to describe a hardware portion of the system LSI for development by using a hardware description language, and then stores the hardware information 21 in the hardware information storage section 23. As shown in FIG. 4A, the hardware information 21 includes module information, such as the number of gates, the number of execution cycles, and the like.

Figure 4B:
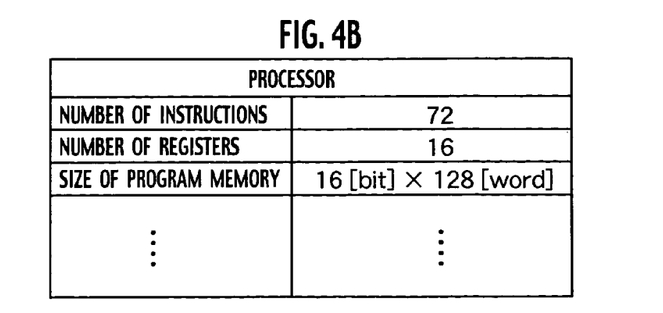
FIG. 4B is an illustration showing an example of processor information of the semiconductor integrated circuit for development.

The processor information input section 32 inputs processor information 31 with regard to the processor of the system LSI for development, and then stores the processor information 31 in the processor information storage section 33. As shown in FIG. 4B, the processor information 31 includes information, such as the size of program memory, the number of instructions, the number of registers, and the like.

Figure 5:
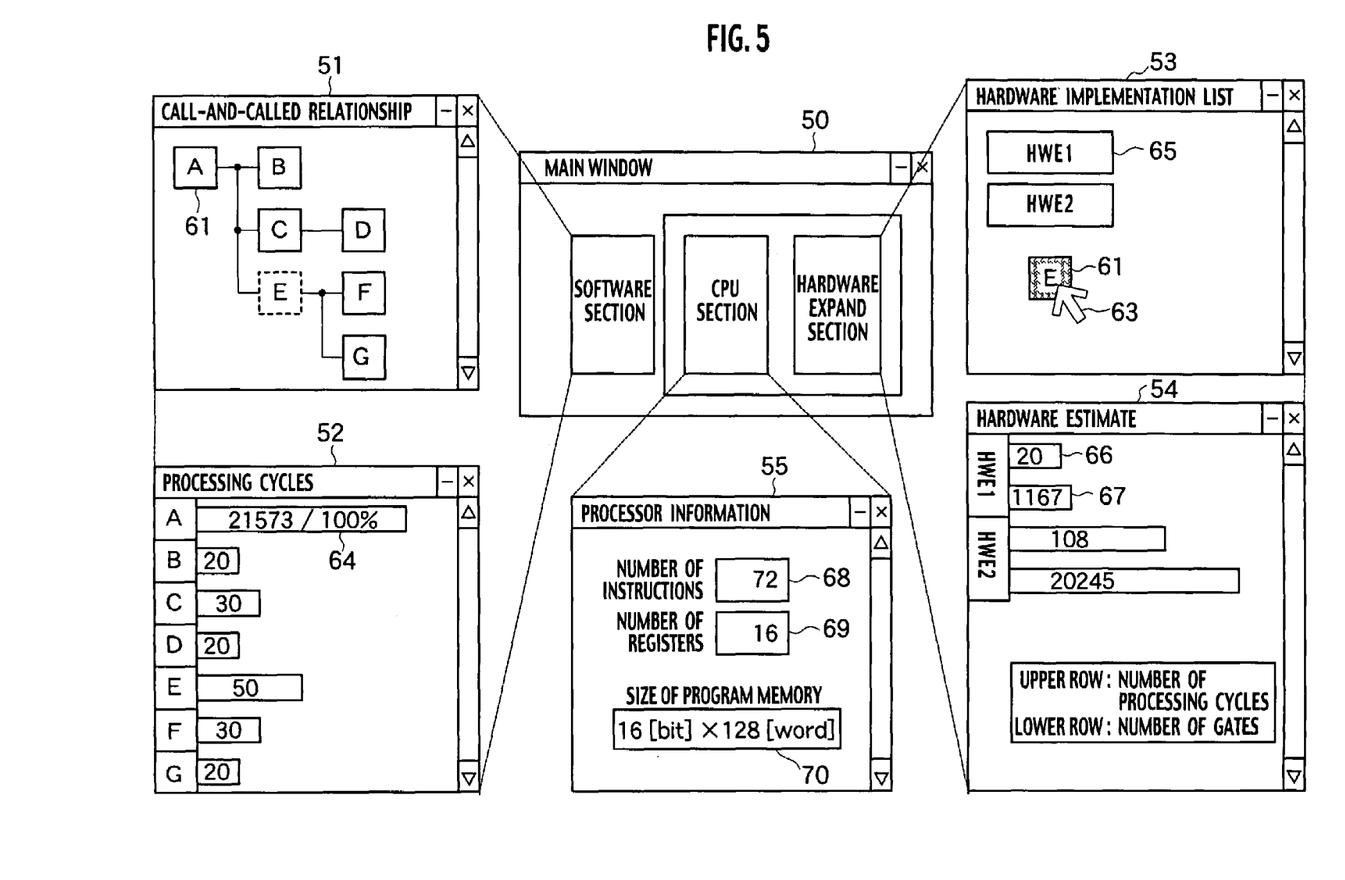
FIG. 5 is an illustration showing an example of a screen layout displayed on a display unit of the design apparatus shown in FIG. 2.

As shown in FIG. 5, the hardware implementation specification section 16 displays the profile stored in the software information storage section 13 as software information on the display unit 42, and further displays the hardware information stored in the hardware information storage section 23 and the processor information stored in the processor information storage section 33 on the display unit 42.

At the time when an algorithm (function) of a portion to be implemented by hardware is selected via the input unit 15 from among the software information displayed on the display unit 42, the hardware implementation specification section 16 outputs a hardware information changing directions signal 45 for directing to change the hardware information and the processor information to the hardware changing section 18, and outputs a software information changing directions signal 44 for directing to change the software information to the software changing section 17. The hardware implementation specification section 16 further outputs a performance analyzing directions signal 46 for directing to analyze a performance to the performance analyzer 41.

The hardware changing section 18 generates automatically hardware descriptions from the algorithm (function) of the specified portion to be implemented by the hardware based on the hardware information changing directions signal 45, and then changes automatically the hardware information stored in the hardware information storage section 23 and the processor information stored in the processor information storage section 33.

The software changing section 17 generates automatically software descriptions in which an algorithm (function) of the specified portion to be implemented by the hardware in the source program is replaced with an algorithm for controlling a newly divided hardware portion, and then changes the software information stored in the software information storage section 13, based on the software information changing directions signal 44. Then, the compiler 14 re-compiles the changed source program and re-obtains the profile, and then changes automatically the software information stored in the software information storage section 13.

The performance analyzer 41 analyzes automatically a performance of the semiconductor integrated circuit based on the changed software information, the changed hardware information and the changed processor information, and then displays a result of the analyses on the display unit 42 and/or outputs a result of the analyses as performance information 43, based on the performance analyzing directions signal 46.

As explained above, the design apparatus according to the embodiment of the present invention displays the software information and the hardware information on the display unit 42 in order to support so that the portion to be implemented by the hardware can be appropriately chosen from among the source program in which the algorithm is described and the functional division can be achieved. The software information includes, for example, the call-and-called relation ship between the functions in the source program, the number of times to call the functions, the number of instructions included in the functions, the number of execution steps and the like. The hardware information includes, for example, the size of the hardware (the number of gates) replaced from the function, the number of execution cycles, the size of program memory of the processor and the like. Then, when the designer selects (for example, drags) the algorithm (for example, the function) of the portion to be implemented by the hardware from among the software information currently displayed on the display unit 42, and then moves (for example, drops) it into the hardware information side, the contents of the software information and the hardware information displayed on the display unit 42 are changed one by one, and the verification information whether or not the required performance for the LSI for the design is achieved is displayed on the display unit 42 in order to support the design.

Processing Operation of Design Apparatus

Figure 6:
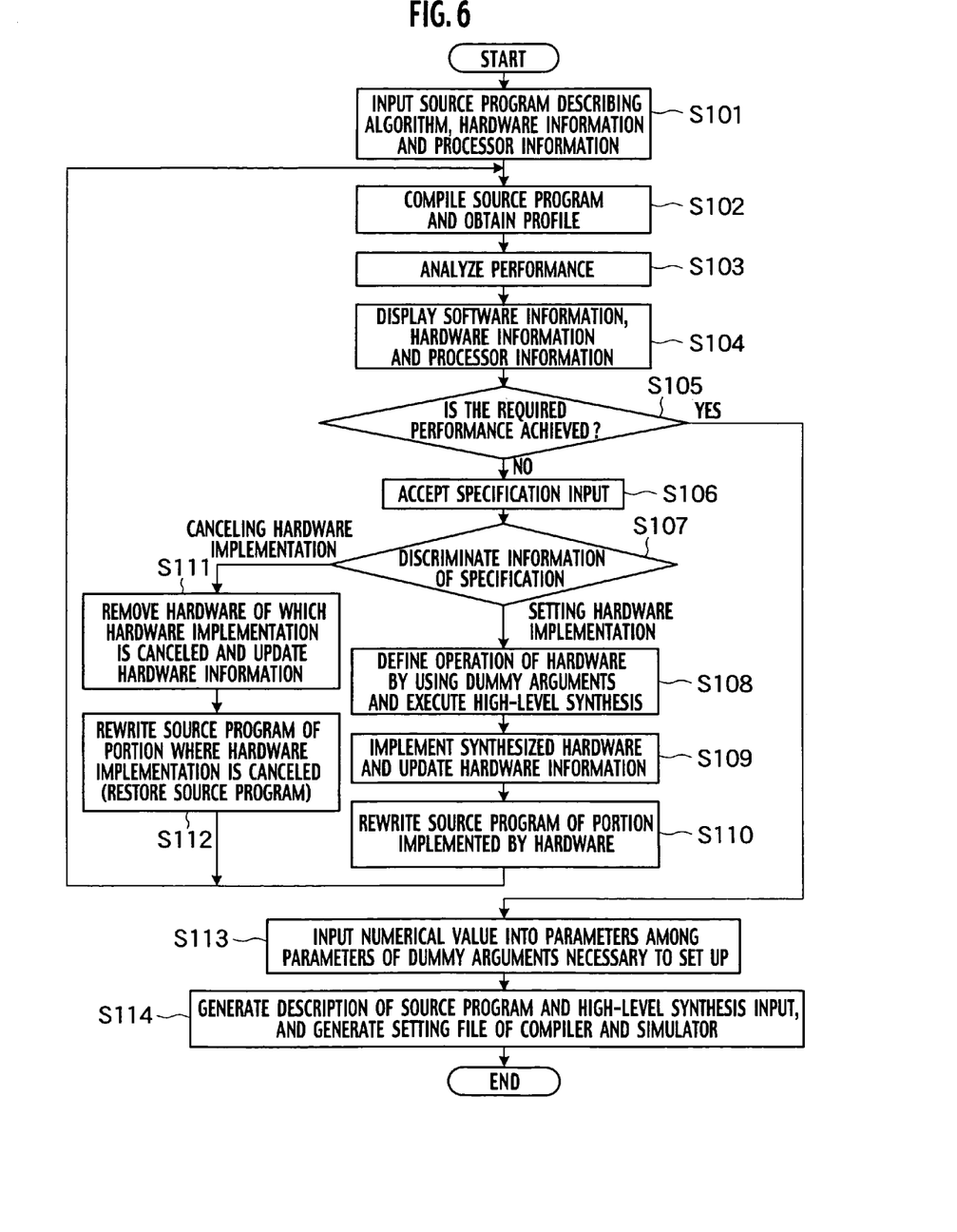
FIG. 6 is a flow chart showing an example of a processing procedure for designing the semiconductor integrated circuit performed by the design apparatus shown in FIG. 2.

FIG. 6 shows an example of a processing procedure for designing semiconductor integrated circuit performed by the design apparatus according to the present embodiment.

In addition, the design processing procedure shown in FIG. 6 can be converted to a computer program, and then the design apparatus of the present embodiment realized by a computer system may be read the computer program stored in a computer-readable recoding medium and may perform each processing described in the computer program.

As shown in FIG. 6, first, in Step S101, the software information input section 12 inputs software information 11 including software descriptions (source program) in which an algorithm required of a system LSI for development is described, and stores the software information 11 in the software information storage section 13. At the same time, the hardware information input section 22 inputs hardware information 21 and stores the hardware information 21 in the hardware information storage section 23, and the processor information input section 32 inputs processor information 31 and stores the processor information 31 in the processor information storage section 33.

In Step S102, the compiler 14 compiles the source program stored in the software information storage section 13, and then obtains a profile.

In step S103, the performance analyzer 41 performs a simulation and analyzes a performance of the system LSI for development based on the software information stored in the software information storage section 13, the hardware information stored in the hardware information storage section 23, and the processor information stored in the processor information storage section 33. In step S104, the performance analyzer 41 displays a result of the performance analysis on the display unit 42. The information displayed on the display unit 42 includes software information, such as a call-and-called relationship between functions, the number of times to call the functions, the number of execution steps, the type of instructions included in the functions and the like, and hardware information, such as information of a standard hardware module of the processor selected by the designer, the predictive size of the hardware replaced from the selected function, the number of execution cycles and the like.

FIG. 5 shows an example of the information displayed on the display unit 42. A call-and-called relationship window 51 and a processing cycle window 52 are windows for displaying the software information. A hardware implementation list window 53 and a hardware estimate window 54 are windows for displaying the hardware information. A processor information window 55 is window for displaying the processor information.

As shown in FIG. 5, a call-and-called relationship of each functions A, B, C, D, E, F and G is displayed on the call-and-called relationship window 51 by using icons 61 developed in the tree-structured shape. The numbers of execution cycles 64 of each functions A, B, C, D, E, F and G are displayed on the processing cycle window 52 by using bar graph. Icons 65 of modules implemented by hardware are displayed on the hardware implementation list window 53, and the numbers of execution cycles 66 and the numbers of the gates 67 of each modules implemented by hardware are displayed on the hardware estimate window 54. The number of instructions, the number of registers and the size of the program memory used by the processor are displayed on the processor information window 55.

In addition, the screen display method may be realized by the hierarchical display method for displaying between the detailed displays and the outline displays one by one in response to specification by the designer, in order that the designer can understand easily.

Returning to the flow chart of FIG. 6, in Step S105, the designer verifies whether or not required performance is achieved. As a result of the verification in Step S105, if the required performance is not achieved, this processing goes to Step S106. On the other hand, if the required performance is achieved, this processing goes to Step S113.

In Step S106, the hardware implementation specification section 16 accepts specification input from the input unit 15. In Step S107, the hardware implementation specification section 16 discriminates whether the accepted specification input indicates "setting hardware implementation" or "canceling hardware implementation". FIG. 5 shows an example that "setting hardware implementation" is performed by selecting (dragging) the icon 61 of the function E by using the mouse cursor 63 among the functions currently displayed on the call-and-called relationship window 51 and then moving (dropping) the icon 61 of the function E into to the hardware implementation list window 53 by using the mouse cursor 63. On the contrary, in the case of "canceling hardware implementation", what is necessary is to select the icon 65 of the hardware module currently displayed on the hardware implementation list window 53 and just to move it into the call-and-called relationship window 51.

As a result of the discrimination of Step S107, if the accepted specification input indicates "setting hardware implementation", the hardware changing section 18, in Step S108, defines operation of the newly implemented hardware by using dummy arguments, and then executes the hardware implementation by high-level synthesis again as needed. Then, in Step S109, the hardware changing section 18 implements the synthesized hardware and update the hardware information stored in the hardware information storage section 23 and the processor information stored in the processor information storage section 33. Further, in Step S110, the software changing section 13 rewrites the algorithm of the source program of the portion implemented by the hardware to the algorithm for controlling the newly implemented hardware, and updates the software information stored in the software information storage section 13.

Figure 7:
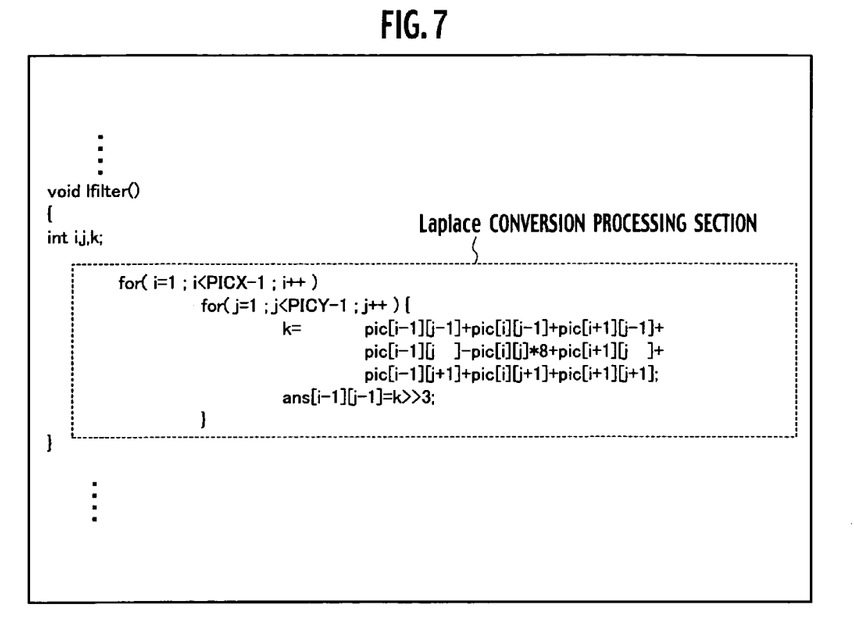
FIG. 7 is an illustration showing an example of a source program including a Laplace conversion function.
Figure 8:
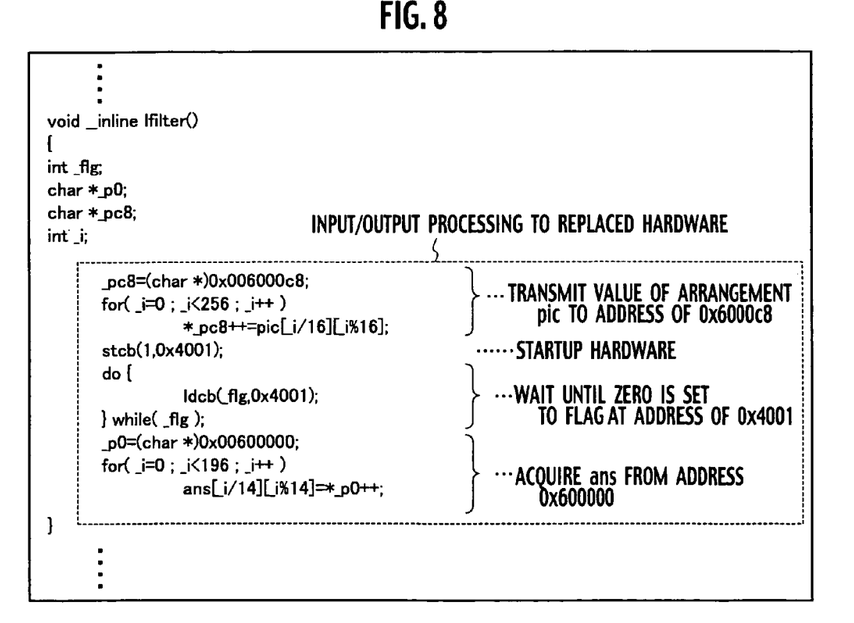
FIG. 8 is an illustration showing an example of a source program replaced by a software changing section, at the time when the Laplace conversion function included in the source program description shown in FIG. 7 is specified to be implemented by hardware.

FIG. 8 shows an example of a source program, described by C programming language, replaced by the software changing section 13, at the time when a Laplace conversion function included in the source program description shown in FIG. 7 is specified to be implemented by hardware.

As shown in FIG. 8, the source program is written to the algorithm for controlling a Laplace conversion circuit, which is specified as "hardware implementation" and implemented by a hardware block as electronic circuit descriptions.

In the source program shown in FIG. 8, the string "stcb( )" is a function which will be replaced with instructions for writing data in a control memory (at address of 0×4001), after compile. The string "ldcb( )" is a function which will be replaced with instructions for reading data from the control memory.

In a pointer operation portion, transmission/reception of the data to/from a local memory (at address 0×6000c8) is performed. In this example, processing is performed in the following order.

First, data of "pic[][]" as image data is transmitted to address of 0×6000c8 (local memory). Next, "1" is written into address of 0×4001 (control memory) and then the hardware (Laplace conversion circuit) is started up.

Then, waiting until "0" is set to a flag at address of 0×4001 (until the processing of the hardware is completed), the main program receives data of "ans[][]" (a result from the Laplace conversion circuit) at the time when "0" is set to the flag at address of 0×4001.

As shown in the source program in FIG. 8, the concrete numerical values are set to the top address of the control memory and/or the local memory not necessarily required of the prediction stage at the time of the completion of hardware implementation specification, and it is therefore possible to generate a simulation model required for the simulation after the functional division.

In addition, when the algorithm of the portion to be implemented by the hardware is selected from among the source program, it may be necessary to add an interface between the software portion of the selected algorithm and the newly defined hardware. The creation method of the interface is disclosed in a system design technology in Japanese patent Laid Open Publication (Kokai) No. 2001-

344298, proposed by the present inventor, the entire contents (all pages) of this reference being incorporated herein by reference.

Thus, the function and source program specified to divide the functions into the hardware are replaced with instructions for input/output of hardware, such as user-defined instructions (the number of execution cycles is obtained from the hardware module information) or the like and a program for a device driver according to the specification. Then, returning to Step S102, the changed source program is re-compiled and then the profile information stored in the software information storage section 13 is updated.

Following the updates of Step S102, in Step S103, the performance analyzer 41 performs the simulation and analyzes the performance of the system LSI for development again. Further, in Step S104, the display contents of the call-and-called relationship window 51 and the processing cycle window 52 for displaying the software information are updated on the display unit 42, and the size, the number of execution cycles and the like of the newly defined hardware module are displayed on the hardware implementation list window 53 and the hardware estimate window 54 for displaying the hardware information. Generally, although signal-processing time, the chip area of LSI, etc. are considered when determining the portion to be implemented by the hardware, the design apparatus according to the present embodiment verifies the type of the instructions used in the processor. Therefore, when the number of the instructions used in the processor is smaller than the predetermined number of instructions as a result of the hardware-implementation of the specified function, the design apparatus according to the present embodiment changes instruction length of the processor in order to reduce the program memory size and displays the result of changes on the processor information window 55.

On the other hand, as a result of the discrimination of Step S107, if the accepted specification of input indicates "canceling hardware implementation", the hardware changing section 18, in Step S111, removes the implemented hardware module and updates the hardware information stored in the hardware information storage section 23 and the processor information stored in the processor information storage section 33. Further, in Step S112, the software changing section 17 rewrites (restores) the algorithm of the source program portion, where the hardware-implementation is canceled, to the algorithm as in previous to the hardware-implementation, and updates the software information stored in the software information storage section 13.

As explained above, the portion to be implemented by the hardware is selected from among the source program (or the hardware-implemented portion is cancelled), and then if the required performance is achieved, this processing goes to Step S113.

In Step S113, concrete numerical values (for example, an top address value, bit width, etc.) or concrete data of a parameter to be added in hardware-implementation are inputted from the input unit 15 or a setting file (not shown), if needed.

As is evident from above explanation, according to the apparatus, the computer implemented method and the computer executable program for designing, the hardware descriptions are generated from the algorithm of the specified portion and hardware information and the processor information are changed one after another, in response to specification of the algorithm of the portion where the hardware-implementation is performed. At the same time, the software descriptions replaced with the algorithm for controlling the implemented hardware are generated from the algorithm of the specified portion in the software descriptions, and the software information is changed one after another. Then, since the performance of the processor is analyzes based on the changed software information, the changed hardware information and the changed processor information, it is possible to obtain easily the information for verifying whether or not the required performance is achieved, whenever the portion replaced with the hardware is selected from the functions described in the source program. Therefore, it is enable to design the system LSI including the configurable processor in consideration of the influence upon the configurable processor.

Furthermore, it is possible to estimate the performance in the case that the portion of the source program, in which the algorithm is described, is implemented by the hardware, in consideration of not only the processing speed or the chip area but also the instruction set used in the processor. Further, since the configuration of the system LSI and various parameters can be checked at the same time by using the GUI, it is possible to grasp the performance verification easily compared with the case where the performance is verified by estimating based on text data, and to consider quickly the implementation method of two or more hardware. Therefore, it is possible to design the system LSI to achieve the required performance at lower cost.

Moreover, since the update information for editing the source program and design environment is generated automatically after the determination of the portion to be implemented by the hardware, it is possible to reduce the number of human mistakes and reduce greatly the length of time required for verifying the system.

According to the present embodiment, in the design of the semiconductor integrated circuit including the configurable processor, it is possible to provide the design apparatus, the design method and the design program, which can obtain easily the information for verifying whether or not the required performance is achieved, whenever the portion replaced with the hardware is selected from the functions described in the source program, and is enable to design the system LSI including the configurable processor in consideration of the influence upon the configurable processor.

Although the embodiments of the present invention have been described in detail, the present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for designing a semiconductor integrated circuit including a processor configurable in accordance with a target, the apparatus comprising:
   a software information storage section configured to store software information including software descriptions in which an algorithm required of the semiconductor integrated circuit is described;
   a hardware information storage section configured to store hardware information including hardware descriptions of the semiconductor integrated circuit;
   a processor information storage section configured to store processor information of the processor;

a hardware implementation specification section configured to specify an algorithm of a portion to be implemented by hardware from among the software descriptions;

a hardware changing section configured to generate hardware descriptions from the algorithm of the specified portion to be implemented by the hardware, and then change the hardware information and the processor information;

a software changing section configured to generate software descriptions in which the algorithm of the specified portion to be implemented by the hardware is replaced with an algorithm for controlling the hardware, and then change the software information; and a performance analyzer configured to analyze a performance of the semiconductor integrated circuit based on the changed software information, the changed hardware information and the changed processor information;

wherein:

the hardware implementation specification section outputs a hardware information changing directions signal for directing to change the hardware information and the processor information, a software information changing directions signal for directing to change the software information and a performance analyzing directions signal for directing to analyze the performance, at the time when the algorithm of the portion to be implemented by hardware is selected;

the hardware changing section generates automatically the hardware descriptions from the algorithm of the specified portion to be implemented by the hardware, and then changes automatically the hardware information and the processor information, based on the hardware information changing directions signal;

the software changing section generates automatically the software descriptions in which the algorithm of the specified portion to be implemented by the hardware is replaced with the algorithm for controlling the hardware, and then changes automatically the software information, based on the software information changing directions signal; and the performance analyzer analyzes automatically the performance of the semiconductor integrated circuit from the changed software information, the changed hardware information and the changed processor information, based on the performance analyzing directions signal.

2. The apparatus of claim 1, wherein the software information includes at least one of information with regard to a call-and-called relationship between functions included in the software descriptions, the number of times to call the functions, the number of instructions included in the functions, the type of the instructions included in the functions and the number of processing cycles.

3. The apparatus of claim 1, wherein the hardware information includes at least one of information with regard to the number of gates and the number of execution cycles.

4. The apparatus of claim 1, wherein the processor information includes at least one of information with regard to the size of program memory, the number of instructions and the number of registers.

5. An apparatus for designing a semiconductor integrated circuit including a processor configurable in accordance with a target, the apparatus comprising:

a software information storage section configured to store software information including software descriptions in which an algorithm required of the semiconductor integrated circuit is described;

a hardware information storage section configured to store hardware information including hardware descriptions of the semiconductor integrated circuit;

a processor information storage section configured to store processor information of the processor;

a hardware implementation specification section configured to specify an algorithm of a portion to be implemented by hardware from among the software descriptions;

a hardware changing section configured to generate hardware descriptions from the algorithm of the specified portion to be implemented by the hardware, and then change the hardware information and the processor information;

a software changing section configured to generate software descriptions in which the algorithm of the specified portion to be implemented by the hardware is replaced with an algorithm for controlling the hardware, and then change the software information; and a performance analyzer configured to analyze a performance of the semiconductor integrated circuit based on the changed software information, the changed hardware information and the changed processor information;

wherein:

the hardware implementation specification section includes an input unit selecting the algorithm of the portion to be implemented by hardware from among the software descriptions included in the software information displayed on the display unit;

the hardware implementation specification section outputs a hardware information changing directions signal for directing to change the hardware information and the processor information, a software information changing directions signal for directing to change the software information and a performance analyzing directions signal for directing to analyze the performance, at the time when the algorithm of the portion to be implemented by hardware is selected;

the hardware changing section generates automatically the hardware descriptions from the algorithm of the specified portion to be implemented by the hardware, and then changes automatically the hardware information and the processor information, based on the hardware information changing directions signal;

the software changing section generates automatically the software descriptions in which the algorithm of the specified portion to be implemented by the hardware is replaced with the algorithm for controlling the hardware, and then changes automatically the software information, based on the software information changing directions signal; and the performance analyzer analyzes automatically the performance of the semiconductor integrated circuit from the changed software information, the changed hardware information and the changed processor information, based on the performance analyzing directions signal.

6. A computer implemented method for designing a semiconductor integrated circuit including a processor configurable in accordance with a target, the computer implemented method comprising:

first analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit;

accepting specification of an algorithm of a portion to be implemented by hardware from among the software descriptions according to a result of the performance analysis;

generating hardware descriptions from an algorithm of the specified portion to be implemented by the hardware, and changing the hardware information and the processor information;

generating software descriptions in which the algorithm of the specified portion to be implemented by the hardware is replaced with an algorithm for controlling the hardware, and changing the software information; and second analyzing the performance of the semiconductor integrated circuit based on the changed software information, the changed hardware information and the changed processor information;

wherein:

in the accepting of specification of the portion to be implemented by hardware, a hardware information changing directions signal for directing to change the hardware information and the processor information, a software information changing directions signal for directing to change the software information and a performance analyzing directions signal for directing to analyze the performance are outputted, at the time when the algorithm of the portion to be implemented by hardware is selected;

in the changing of the hardware information, the hardware descriptions from the algorithm of the specified portion to be implemented by the hardware are generated automatically, and then the hardware information and the processor information are changed automatically, based on the hardware information changing directions signal;

in the changing of the software information, the software descriptions in which the algorithm of the specified portion to be implemented by the hardware is replaced with the algorithm for controlling the hardware are generated automatically, and then the software information is changed automatically, based on the software information changing directions signal; and in the second analysis of the performance, the performance of the semiconductor integrated circuit is analyzed automatically from the changed software information, the changed hardware information and the changed processor information, based on the performance analyzing directions signal.

7. The computer implemented method of claim 6, wherein the software information includes at least one of information with regard to a call-and-called relationship between functions included in the software descriptions, the number of times to call the functions, the number of instructions included in the functions, the type of the instructions included in the functions and the number of processing cycles.

8. The computer implemented method of claim 6, wherein the hardware information includes at least one of information with regard to the number of gates and the number of execution cycles.

9. The computer implemented method of claim 6, wherein the processor information includes at least one of information with regard to the size of program memory, the number of instructions and the number of registers.

10. A computer readable medium containing computer executable program, which when executed on computer for designing a semiconductor integrated circuit including a processor configurable in accordance with a target, the computer executable program comprising:

first analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit;

accepting specification of an algorithm of a portion to be implemented by hardware from among the software descriptions according to a result of the performance analysis;

generating hardware descriptions from an algorithm of the specified portion to be implemented by the hardware, and changing the hardware information and the processor information;

generating software descriptions in which the algorithm of the specified portion to be implemented by the hardware is replaced with an algorithm for controlling the hardware, and changing the software information; and second analyzing the performance of the semiconductor integrated circuit based on the changed software information, the changed hardware information and the changed processor information;

wherein:

in the accepting of specification of the portion to be implemented by hardware, a hardware information changing directions signal for directing to change the hardware information and the processor information, a software information changing directions signal for directing to change the software information and a performance analyzing directions signal for directing to analyze the performance are outputted, at the time when the algorithm of the portion to be implemented by hardware is selected;

in the changing of the hardware information, the hardware descriptions from the algorithm of the specified portion to be implemented by the hardware are generated automatically, and then the hardware information and the processor information are changed automatically, based on the hardware information changing directions signal;

in the changing of the software information, the software descriptions in which the algorithm of the specified portion to be implemented by the hardware is replaced with the algorithm for controlling the hardware are generated automatically, and then the software information is changed automatically, based on the software information changing directions signal; and in the second analysis of the performance, the performance of the semiconductor integrated circuit is analyzed automatically from the changed software information, the changed hardware information and the changed processor information, based on the performance analyzing directions signal.

11. The computer executable program of claim 10, wherein the software information includes at least one of information with regard to a call-and-called relationship between functions included in the software descriptions, the number of times to call the functions, the number of instructions included in the functions, the type of the instructions included in the functions and the number of processing cycles.

12. The computer executable program of claim 10, wherein the hardware information includes at least one of information with regard to the number of gates and the number of execution cycles.

13. The computer executable program of claim 10, wherein the processor information includes at least one of information with regard to the size of program memory, the number of instructions and the number of registers.

14. A computer readable medium containing computer executable program, which when executed on computer for designing a semiconductor integrated circuit including a processor configurable in accordance with a target, the computer executable program comprising:
   first analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit;
   accepting specification of an algorithm of a portion to be implemented by hardware from among the software descriptions according to a result of the performance analysis;
   generating hardware descriptions from an algorithm of the specified portion to be implemented by the hardware, and changing the hardware information and the processor information;
   generating software descriptions in which the algorithm of the specified portion to be implemented by the hardware is replaced with an algorithm for controlling the hardware, and changing the software information; and
   second analyzing the performance of the semiconductor integrated circuit based on the changed software information, the changed hardware information and the changed processor information;
   wherein;
   in the accepting of specification of the portion to be implemented by hardware, the specification of the algorithm of the portion to be implemented by hardware from among the software descriptions included in the software information displayed on a display unit is accepted from an input unit;
   in the accepting of specification of the portion to be implemented by hardware, a hardware information changing directions signal for directing to change the hardware information and the processor information, a software information changing directions signal for directing to change the software information and a performance analyzing directions signal for directing to analyze the performance are outputted, at the time when the algorithm of the portion to be implemented by hardware is selected;
   in the changing of the hardware information, the hardware descriptions from the algorithm of the specified portion to be implemented by the hardware are generated automatically, and then the hardware information and the processor information are changed automatically, based on the hardware information changing directions signal;
   in the changing of the software information, the software descriptions in which the algorithm of the specified portion to be implemented by the hardware is replaced with the algorithm for controlling the hardware are generated automatically, and then the software information is changed automatically, based on the software information changing directions signal; and
   in the second analysis of the performance, the performance of the semiconductor integrated circuit is analyzed automatically from the changed software information, the changed hardware information and the changed processor information, based on the performance analyzing directions signal.

15. A computer implemented method for designing a semiconductor integrated circuit including a processor configurable in accordance with a target, the computer implemented method comprising:
   first analyzing a performance of the semiconductor integrated circuit based on software information stored in a software information storage section, hardware information stored in a hardware information storage section and processor information stored in a processor information storage section, the software information including software descriptions in which an algorithm required of the semiconductor integrated circuit is described, the hardware information including hardware descriptions of the semiconductor integrated circuit;
   accepting specification of an algorithm of a portion to be implemented by hardware from among the software descriptions according to a result of the performance analysis;
   generating hardware descriptions from an algorithm of the specified portion to be implemented by the hardware, and changing the hardware information and the processor information;
   generating software descriptions in which the algorithm of the specified portion to be implemented by the hardware is replaced with an algorithm for controlling the hardware, and changing the software information; and
   second analyzing the performance of the semiconductor integrated circuit based on the changed software information, the changed hardware information and the changed processor information;
   wherein:
   in the accepting of specification of the portion to be implemented by hardware, the specification of the algorithm of the portion to be implemented by hardware from among the software descriptions included in the software information displayed on a display unit is accepted from an input unit;
   in the accepting of specification of the portion to be implemented by hardware, a hardware information changing directions signal for directing to change the hardware information and the processor information, a software information changing directions signal for directing to change the software information and a performance analyzing directions signal for directing to analyze the performance are outputted, at the time when the algorithm of the portion to be implemented by hardware is selected;

in the changing of the hardware information, the hardware descriptions from the algorithm of the specified portion to be implemented by the hardware are generated automatically, and then the hardware information and the processor information are changed automatically, based on the hardware information changing directions signal;

in the changing of the software information, the software descriptions in which the algorithm of the specified portion to be implemented by the hardware is replaced with the algorithm for controlling the hardware are generated automatically, and then the software information is changed automatically, based on the software information changing directions signal; and in the second analysis of the performance, the performance of the semiconductor integrated circuit is analyzed automatically from the changed software information, the changed hardware information and the changed processor information, based on the performance analyzing directions signal.

* * * * *